(12) United States Patent
Redorta et al.

(10) Patent No.: US 7,543,249 B2
(45) Date of Patent: Jun. 2, 2009

(54) EMBEDDED SWITCHABLE POWER RING

(75) Inventors: Sergi Redorta, Le Bar sur Loup (FR); Julien Louche, Cannes (FR)

(73) Assignee: Infineon Technologies AG (DE)

( * ) Notice: Subject to any disclaimer, the term of this patent is extended or adjusted under 35 U.S.C. 154(b) by 297 days.

(21) Appl. No.: 11/230,085

(22) Filed: Sep. 19, 2005

(65) Prior Publication Data

US 2006/0093129 A1 May 4, 2006

(30) Foreign Application Priority Data

Sep. 20, 2004 (EP) .................. 04022362

(51) Int. Cl.
*G06F 17/50* (2006.01)
*H04M 1/00* (2006.01)

(52) U.S. Cl. ............ 716/1; 716/2; 716/8; 716/10; 716/12; 716/13; 716/19; 379/413

(58) Field of Classification Search .......... 716/1, 716/2, 8, 10, 12, 13, 19; 326/38, 83; 257/415, 257/666, 691
See application file for complete search history.

(56) References Cited

U.S. PATENT DOCUMENTS

| 5,760,428 | A | | 6/1998 | Colwell et al. ............ 257/206 |
| 5,784,291 | A | * | 7/1998 | Chen et al. ................ 716/10 |
| 6,133,755 | A | * | 10/2000 | Huang et al. .............. 326/83 |
| 6,140,837 | A | * | 10/2000 | Eaton et al. ............... 326/38 |
| 6,324,677 | B1 | | 11/2001 | Fischer et al. ............. 716/16 |
| 6,457,157 | B1 | * | 9/2002 | Singh et al. ................ 716/2 |
| 6,480,989 | B2 | * | 11/2002 | Chan et al. ................. 716/8 |
| 6,714,903 | B1 | * | 3/2004 | Chu et al. ................. 703/19 |
| 6,820,240 | B2 | * | 11/2004 | Bednar et al. .............. 716/1 |
| 6,833,597 | B2 | * | 12/2004 | Blasko ................... 257/415 |
| 6,891,260 | B1 | * | 5/2005 | Mora et al. ............. 257/691 |
| 7,080,341 | B2 | * | 7/2006 | Eisenstadt et al. .......... 716/13 |
| 7,234,124 | B2 | * | 6/2007 | Chen et al. ............... 716/13 |
| 2005/0121753 | A1 | * | 6/2005 | Lee et al. ................ 257/666 |
| 2008/0022252 | A1 | * | 1/2008 | Tokunaga et al. .......... 716/12 |

FOREIGN PATENT DOCUMENTS

| EP | 0 563 921 A2 | 3/1993 |
| EP | 0 848 426 A1 | 11/1997 |

* cited by examiner

*Primary Examiner*—Helen Rossoshek
(74) *Attorney, Agent, or Firm*—Dickstein, Shapiro, LLP.

(57) ABSTRACT

An integrated circuit comprises an embedded switchable power ring for supplying power to circuit modules (15.1, . . . , 15.5) arranged within the switchable power ring (13). The switchable power ring (13) comprises a switch control unit (20) for generating an on/off control signal and multiple switch power units (30) controlled by the on/off control signal for providing a switched current as power supply for the circuit modules (15.1, . . . , 15.5). The multiple switch power units (30) being arranged in a ring shape on the integrated circuit (2').

17 Claims, 5 Drawing Sheets

EMBEDDED SWITCHABLE POWER RING

CROSS-REFERENCE TO RELATED APPLICATIONS

This application claims priority from European Patent Application No. 04 022 362.0, which was filed on Sep. 20, 2004, and is incorporated herein by reference in its entirety.

TECHNICAL FIELD

The invention relates to the design of power-efficient integrated circuits and, more specifically, to an integrated circuit comprising an embedded switchable power supply. Further, the invention relates to a method for designing the layout of an integrated circuit.

BACKGROUND

Power consumption of SoCs (systems-on-chip) has grown to be of crucial importance in the recent years. The current industry trend in portable computing devices demonstrates the demand for increased performance combined with low power/energy consumption. So the quest to optimise system-wide power use and maximise battery life has produced several approaches for intelligently and dynamically adjusting performance and power consumption on a chip.

One approach is to operate various chip areas with different supply voltages and/or different clock rates in order to reduce power consumption.

In view of static power consumption reduction, the high leakage current in deep submicron CMOS circuits is becoming a significant contributor to power dissipation as threshold voltage, channel length and gate oxide thickness are reduced. Thus, multiple threshold voltage design approach is required for reducing leakage current. As high threshold voltage (HVT) design shows substantial lower leakage current than regular threshold voltage (RVT) design, leakage power can be saved by this approach. However, to maintain the time advantages of RVT, the usage of RVT for specific components remains a must in chip design.

More specifically, the leakage currents between RVT and HVT can vary as a function of the technology compared. As an example, in the 0.13 µm technology, leakage current in RVT design is a factor of 18 larger than leakage current in HVT design. Considering 90 nm technology, the factor is 65. As a last example, a factor of 25 is observed when comparing the leakage current in 90 nm technology of RVT design to the leakage current in 0.13 µm technology of HVT design.

Switching off any unused parts of the integrated circuit is a further possible strategy to achieve a significant reduction of the static power consumption of the device. Powering down some parts of a CMOS circuit has been done externally since now. FIG. 1 illustrates a typical scheme of a printed circuit board (PCB) 1 supporting a chip 2 and a power control device 3. The power control device 3 is connected to power supply input pads 4.1, 4.2, 4.3 of chip 2 via lines PWR1, PWR2. On-chip power routing is performed by a so called power supply ring 5 running at the chip 2 periphery. The power supply ring 5 is a two wire structure providing VDD and VSS. Embedded modules 6.1, 6.2 of the integrated circuit are connected to the power supply ring 5 by two-wire VDD/VSS-connections 8 extending over the chip 2 under a regular distance. The entire chip 2 or specific parts thereof may be switched off by the power control device 3 if appropriate.

External power switch control strategy has disadvantages in two regards. From the integrated circuit point of view, extra supply input pads 4.1, 4.2, 4.3 are needed leading to a bigger chip area. This disadvantage can be very important in case of a pad-limited chip design. From the customer point of view, the PCB 1 becomes more complicated. It may even be the case that extra metal layers are needed. This increases both the board price and the final product price.

Further, it is known from prior art that memories can be switched off internally with an embedded component often called "romswitch" as shown in FIG. 2. FIG. 2 shows a plurality of embedded memories M1, ..., Mn (n is an integer greater than 1), which are arranged adjacent to one another. Two romswitches 7.1, 7.2 are arranged at both sides of the series of memories M1, ..., Mn. Each romswitch 7.1, 7.2 is fed by the global power wires VDD and VSS. The romswitches 7.1, 7.2 are controlled by a power control signal pwr_cntrl. Depending on the logical state of the power control signal pwr_cntrl, the input wire VDD is connected to an output wire VDD_MEM. VSS and VDD_MEM are routed to the memories M1, ..., Mn as a power supply. Thus, depending on the logical state of the control signal pwr_cntrl, the memories M1, ..., Mn are switched on and off by the on-chip romswitches 7.1, 7.2.

This "romswitch strategy" has many disadvantages. The romswitch components must be hard coded in the VHDL (very high speed hardware description language) source code, kept during design flow synthesis and placed manually during the floor-planning. The different shape availabilities for such a romswitch component may also limit the design variability.

SUMMARY

Therefore, it is an object of the present invention to provide for a cost-effective and design advantageous integrated circuit with switchable circuit blocks. Further, the invention aims to provide for a computer program comprising a cell library for design flow development of integrated circuits, which supports design flow development of an integrated circuit having optimised power supply structure design and reduced power consumption.

The object of the invention is achieved by an integrated circuit comprising an embedded switchable power ring for supplying power to circuit modules arranged within the switchable power ring, the switchable power ring comprising a switch control unit for generating an on/off control signal, and multiple switch power units controlled by the on/off control signal for providing a switched current as power supply for the circuit modules, the multiple switch power units being arranged in a ring shape on the integrated circuit.

The switch control unit of the switchable power ring can be an integral part of the ring shape. The embedded switchable power ring may comprise two global power wires and one switched power wire, wherein one of the global power wires and the switched power wire are connected to the circuit modules arranged within the switchable power ring. The two global power wires and the one switched power wire can be established in two metal layers of the integrated circuit. The two metal layers can be metal2 and metal3. The switch control unit and the switch power units can be designed so as to directly abut to one another. A plurality of embedded switchable power rings can be established on the integrated circuit.

The object can also be achieved by a method for designing the layout of an integrated circuit using a computer program for executing a cell layout designing process and a cell library storing cell data, the method comprising the steps of:

registering a first cell representing a switch control unit for generating an on/off control signal by the cell library, and registering a second cell representing a switch power unit controlled by the on/off control signal for providing a switched current for on-chip power supply, and placing a plurality of second cells in the shape of a ring on the integrated circuit.

At least some of the second cells can be placed in direct abutment to one another. The first cell can be placed to become integral part of the ring shape.

According one embodiment, an integrated circuit comprises an embedded switchable power ring for supplying power to circuit modules arranged within the switchable power ring. The switchable power ring comprising a switch control unit for generating an on/off control signal and multiple switch power units controlled by the on/off control signal for providing a switched current as power supply for the circuit modules. The multiple switch power units and preferably also the switch control unit are being arranged in a ring shape on the integrated circuit.

Thus, the basic concept of the invention is an embedded switchable power ring that can be used to internally switch on/off the power for any desired design part or component (circuit modules) of a chip. This allows to achieve a significant reduction of the static power consumption (related to the leakage current) of the device.

Further, the invention combines the favourable power distribution performance of an conventional (two wire) power ring with the on-chip power switching facility of the (however modified) "romswitch" strategy (cf. FIG. 2). The idea is to partition a conventional romswitch into its switch control unit and its switch power unit, to provide a multiplicity of switch power units and to arrange these units (multiple switch power units and, optionally, the switch control unit) in a ring shape on the integrated circuit.

The power ring implementation can be made without any big impact in terms of area and design complexity. Further, the power will be distributed in a regular manner (all sides of the power ring internal circuit modules may be used for power supply input) similar to conventional (two wire) power rings, which are known as one of the best ways to distribute power on a chip. Further, the power part (i.e. the multiple switch power units) of the embedded power ring will be automatically scaled depending on the perimeter of the ring. So, bigger areas within the power ring will have stronger switches to provide enough current to the circuit modules in this internal area.

Preferably, the embedded switchable power ring comprises two global power wires and one switched power wire, wherein one of the global power wires and the switched power wire are connected to the circuit modules arranged within the switchable power ring. The switchable power wire may either be switched VSS or switched VDD.

A preferred implementation of the embedded switchable power ring requires that the two global power wires and the one switched power wire are established in two metal layers of the integrated circuit. In this case, it is preferred to use as lower metal layers as possible, preferably metal2 and metal3. Using as lower metal layers as possible improves the routability of the internal connections (i.e. the pin accessibility) to the circuit modules surrounded by the embedded switchable power ring.

Preferably, the switch power units are designed so as to directly abut to one another. Then, the embedded switchable power ring may be designed without spacer cells or wiring needed between the switch power units.

Preferably, a plurality of embedded switchable power rings is established on the integrated circuit. The embedded switchable power rings can independently switch on and off the surrounded areas on the chip. Such design allows for a flexible and low-cost power routing management on the chip with optimum power reduction performance.

Further, the invention relates to a method for designing the layout of an integrated circuit using a computer program for executing a cell layout designing process and a cell library storing cell data. The cell library registers a first cell representing a switch control unit for generating an on/off control signal, and a second cell representing a switch power unit controlled by the on/off control signal for providing a switched current for on-chip power supply. The method comprises the step of placing second cells in the shape of a ring, preferably in direct abutment to one another.

According to this method, a simple and low-cost design of the embedded switchable power ring is possible. As a further advantage, the embedded switchable power ring structure is similar to a conventional pad ring. Therefore, algorithms already exist to place such components (here: the second cells and optionally the first cell) in a ring shape. Therefore, conventional computer programs used for designing the layout of a semiconductor device may be used (optionally with some modifications) for laying out the embedded switchable power ring using a cell library in which the first and second cells are registered.

BRIEF DESCRIPTION OF THE DRAWINGS

The invention may best be understood by reference to the following description taken in connection with the accompanying drawings, in which.

DETAILED DESCRIPTION

Figure 1:
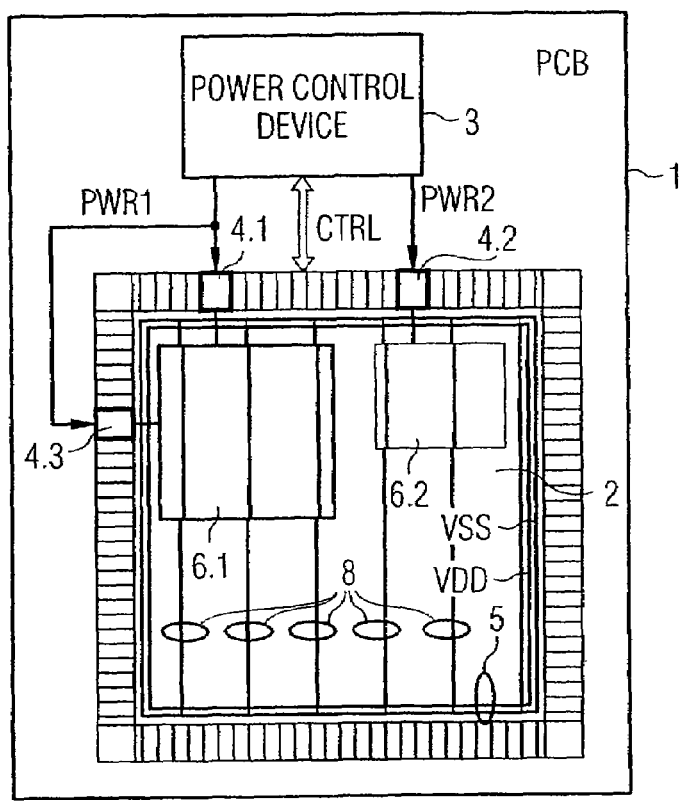
FIG. 1 is a diagram illustrating a typical state-of-the-art powering scheme of a printed circuit board with external power control.
Figure 2:
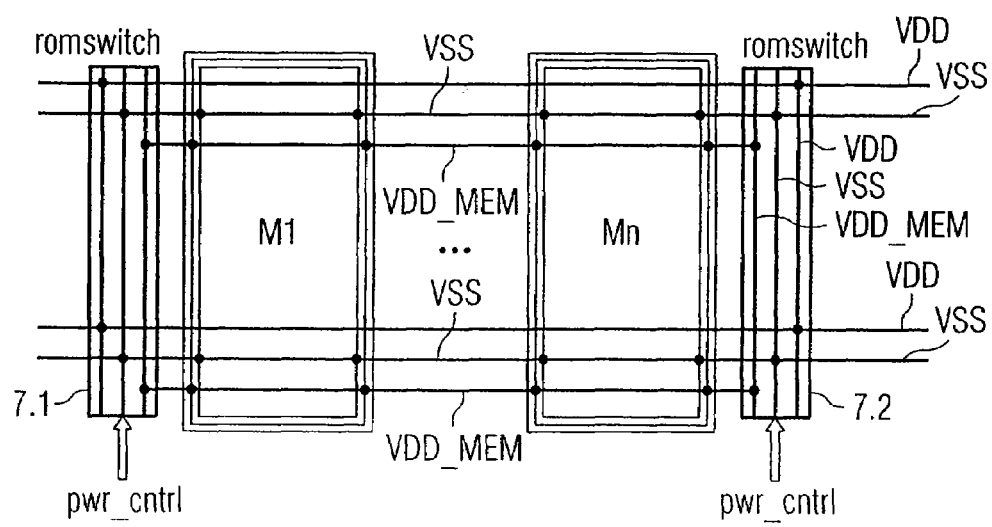
FIG. 2 is a diagram illustrating a state-of-the-art powering scheme for an embedded power switch for memory.
Figure 3:
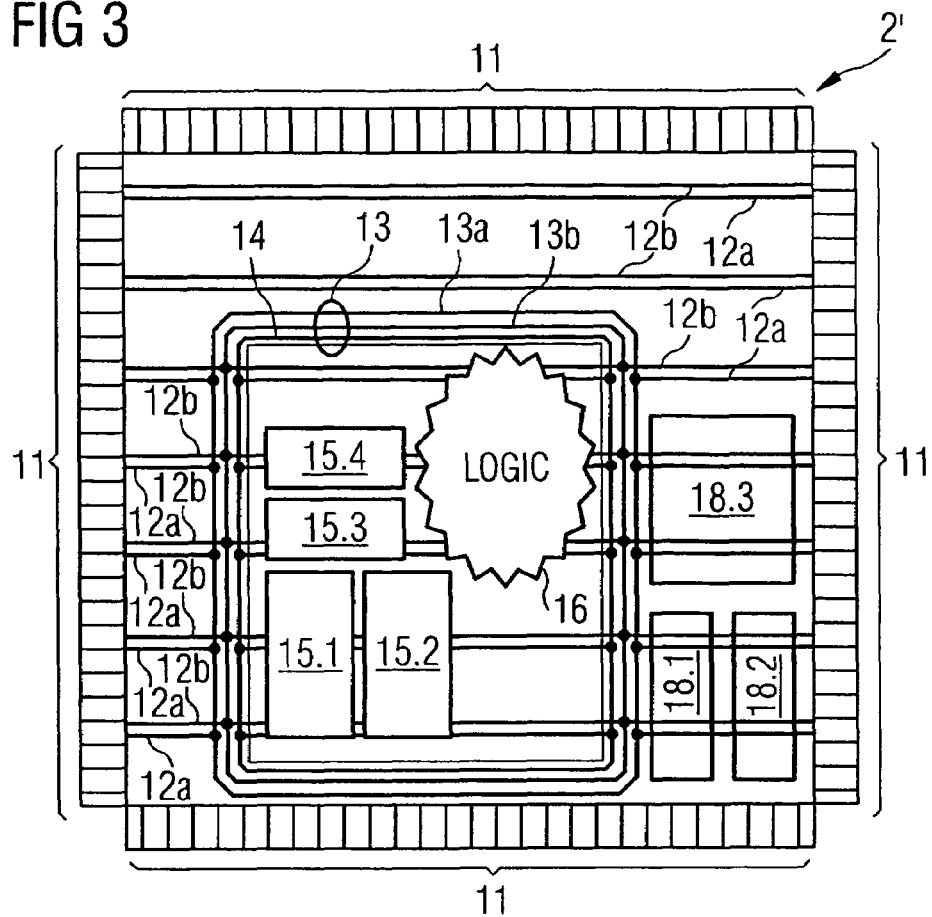
FIG. 3 is a diagram illustrating a powering scheme according to the invention using an embedded power ring defining one switchable power area on the integrated circuit.

FIG. 3 shows a floorplan of a chip layout. As usual, series of pads 11 are arranged at the periphery of the chip 2'. VSS and VDD wiring 12*a*, 12*b* extends over the chip 2' from one side to the other. A switchable power ring 13 having three power/ground wires (i.e. one more than the standard power ring) is provided on the chip 2'. VSS wires are denoted by the suffix a and VDD wires are denoted by the suffix b. In addition to VSS wire 13*a* and VDD wire 13*b*, the power ring 13 has a switched VSS wire 14.

A hierarchical entity or block is enclosed by the switchable power ring 13. The hierarchical entity comprises one or more functional modules 15.1, 15.2, 15.3, 15.4 electrically connected to VDD wire 13b and switched VSS wire 14. The functional modules 15.1, ..., 15.4 are embedded on-chip modules of the integrated circuit 2' or SoC design, for instance memories, logic, controllers, processor cores, interfaces, etc. Further, the switchable power ring 13 encloses a logic module 16. As any component situated within the switchable power ring 13, the logic module 16 is also powered by VDD wire 13b and switched VSS wire 14.

An enable signal PWR_CTRL 17 (cf. FIG. 4) is provided for activating/deactivating the embedded switchable power ring 13. In the activated state, the switched VSS wire 14 is connected to VSS wire 13a, in deactivated state, the switched VSS wire 14 is cut-off from VSS wire 13a. The enable signal PWR_CTRL 17 has to be generated by some part of the chip where the power is always on, i.e. some part outside the power ring 13.

The integrated circuit 2' may comprise further functional modules 18.1, 18.2 and 18.3, which are external to the embedded switchable power ring 13. These functional modules 18.1, 18.2, 18.3 are connected to VSS wire 12a and VDD wire 12b.

It is to be noted that switched wire 14 may also support switched VDD instead of switched VSS as shown in FIG. 3. In this case wires 12a and 13a are VDD wires and wires 12b and 13b are VSS wires.

Figure 4:
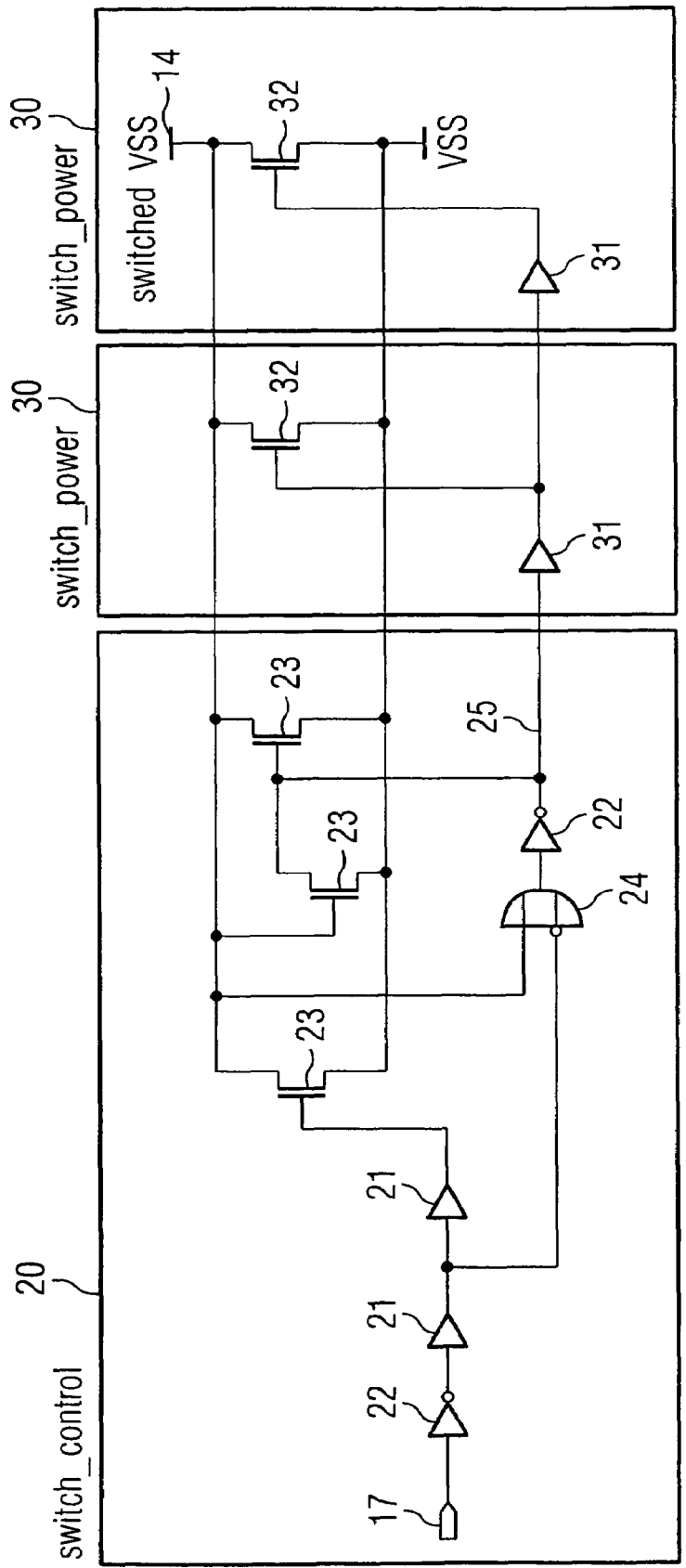
FIG. 4 is a diagram illustrating the circuitry and arrangement of three sub-blocks of the embedded switchable power ring.

FIG. 4 illustrates two basic building blocks of the embedded switchable power ring 13, namely the switch control sub-block 20 and the switch power sub-block 30.

The switch control sub-block 20 consists of driver 21, inverter 22, FETs 23 and an OR-gate with one inverted input 24. The switch power sub-blocks 30 have a driver 31 and a FET 32, the gate thereof is controlled by the driver 31 output.

Depending on the voltage level of a switch power control signal 25 as output by the switch control sub-block 20, the FET 32 of switch power sub-block 30 is gated or conductive. If FET 32 is gated, the embedded switchable power ring is switched off. Otherwise, in the conductive state, the embedded switchable power ring 13 is switched on.

The switch control sub-block 20 and one switch power sub-block 30, in combination, contain the circuitry of a conventional romswitch 7.1, 7.2. Starting from such conventional romswitch, the idea of the invention is to separate such romswitch in the switch control sub-block 20 and in the switch power sub-block 30, to provide for a plurality of switch power sub-blocks 30 and to use this plurality of switch power sub-blocks 30 as building blocks of a power ring as depicted in FIG. 3. It is to be noted that driver 31 routes the control signal 25 from one switch power sub-block 30 to the next switch power sub-block 30. Multiple switch power sub-blocks 30 are needed to provide enough current to the components 15.1, ..., 15.4, 16 encircled by the power ring 13.

Figure 5:
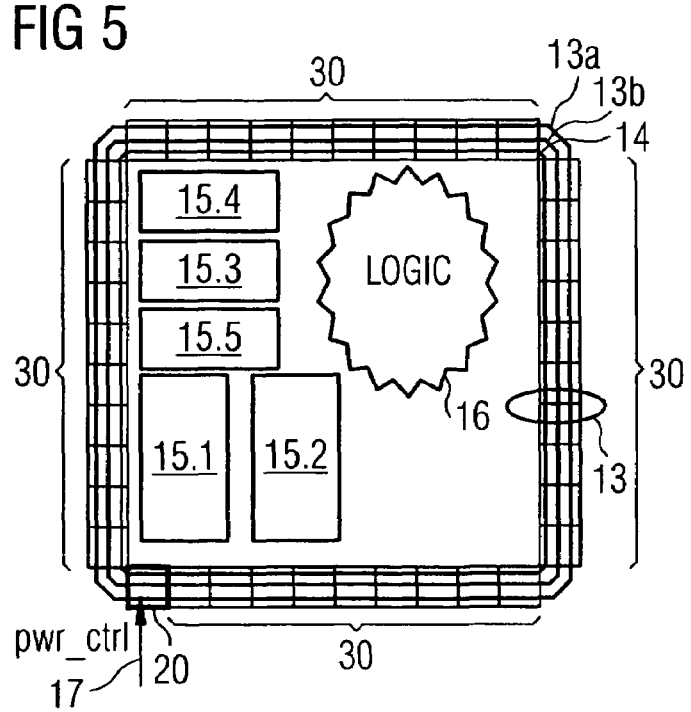
FIG. 5 is a diagram illustrating an embedded switchable power ring architecture.

FIG. 5 illustrates an implementation example of the embedded switchable power ring 13. Identical or similar parts are denoted by the same reference signs as used in the previous figures. From FIG. 5, it can be seen that the switch power sub-blocks 30 illustrated as rectangles are arranged in direct abutment to one another without any separation in between. Further, in this example, the one switch control sub-block 20 is integrated in the embedded switchable power ring 13. In relation to the known concept of romswitches, this means that the sub-blocks 20 and 30 have to be redesigned in a way that makes it possible to abut as many sub-blocks 20, 30 as needed, cf. FIG. 5. The power ring 13 is then created by abutting these sub-blocks 20, 30, 30, ..., 30 or 30, 30, ..., 30. The switch control sub-block 20 is controlled by the external enable signal 17 (PWR_CTRL).

Of course, the design shown in FIG. 5 is flexible and the invention also covers cases in which one or more switch power sub-blocks 30 are replaced by a triple wire connection.

Figure 6:
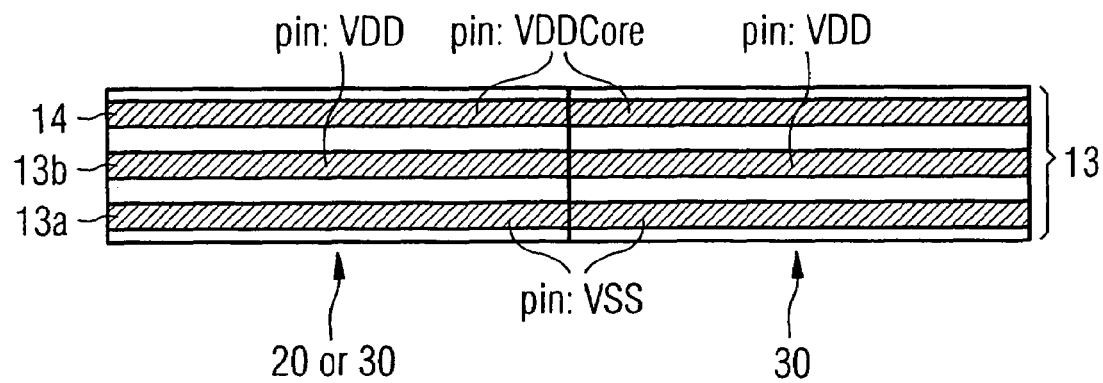
FIG. 6 is a layout of two sub-blocks of the power ring architecture of FIG. 5.

FIG. 6 illustrates the layout of the switchable power ring 13 architecture in more detail. There are shown two sub-blocks, either switch control sub-block 20 and switch power sub-block 30 or two switch power sub-blocks 30. It is apparent from FIG. 6 that the connectors (pins) 13a (VSS), 13b (VDD) and 14 (here switched VDD) are aligned to one another and are in direct electrical contact.

Figure 7:
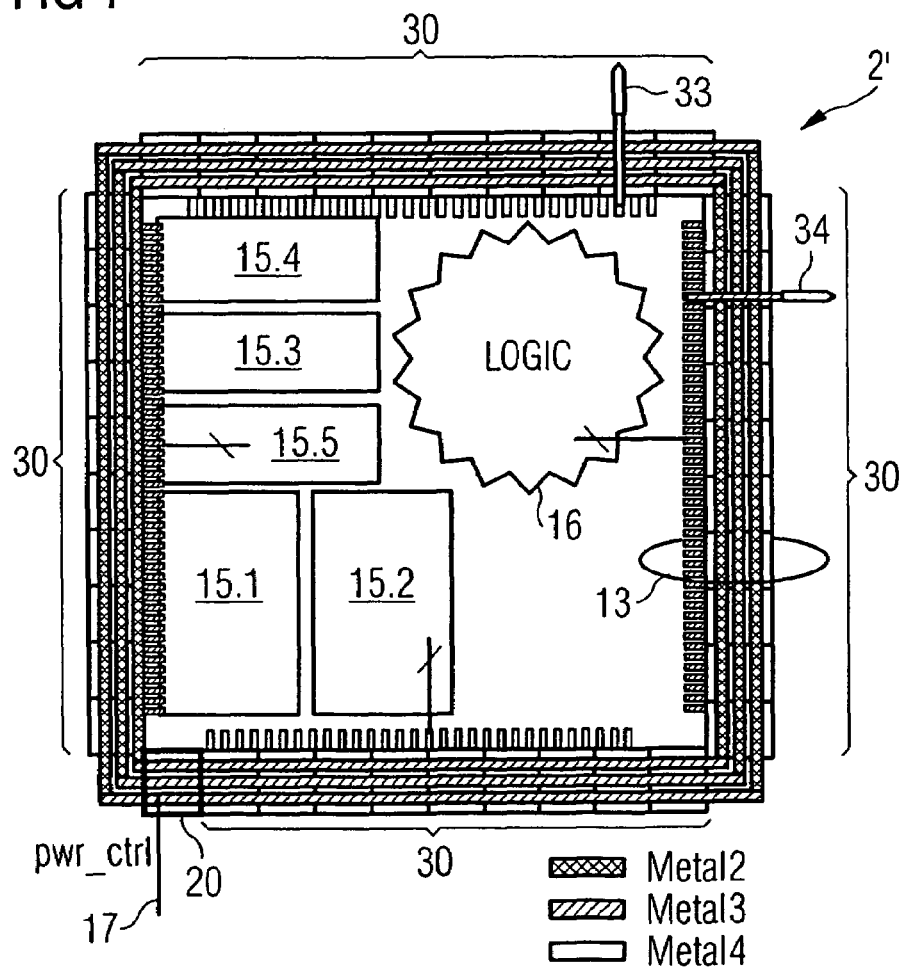
FIG. 7 is a diagram illustrating an embedded switchable power ring implemented in metal2 and metal3 of an integrated circuit.

FIG. 7 illustrates the implementation of the embedded switchable power ring 13 in metal2 and metal3 of a chip layout. It appears that the ring wiring of the power ring 13 is generated in metal2 for horizontal wiring and in metal3 for vertical wiring. Power ring-internal pins are established in metal3 for pin series orientated in vertical direction and are generated in metal4 for pin series orientated in horizontal direction. Signal routing into or out of the power ring 13 is performed by exemplary wires 33, 34 connected to the internal pins. It is desired to use as lower metal layers as possible for the wiring of the switchable power ring 13 in order to maintain high pin accessibility to the circuit modules 15.1, ..., 15.5 surrounded by the embedded switchable power ring 13. This ensures that the power ring 13 blocks only these lower metal layers and that the higher metal layers can be used for routing signals over the power ring 13 by wires 33, 34. Therefore, metal2 and metal3 (i.e. the second and third lowest metal layers of the metal layer design of the chip 2') are preferred for implementing the power ring 13.

One of the most important advantages of the invention is the fact that powering down of any design part or components of the chip 2' can be implemented internally. This increases the granularity of the components that can be powered down within the integrated circuit. Thus, no extra power pads will be needed and the power control strategy will become easier and faster as there is no need to interface to another chip. The power-on can be done smoothly to avoid any current pick-up and chip voltage drop that could have timing impacts on other working parts of the design.

A plurality of embedded switched power ring 13 (probably using different supply voltages) may be arranged on one chip 2'. In this case, it is preferred that the various enable signals 17 for each ring 13 are generated in a power control unit situated in a chip domain that is always on, usually called standby.

Figure 8:
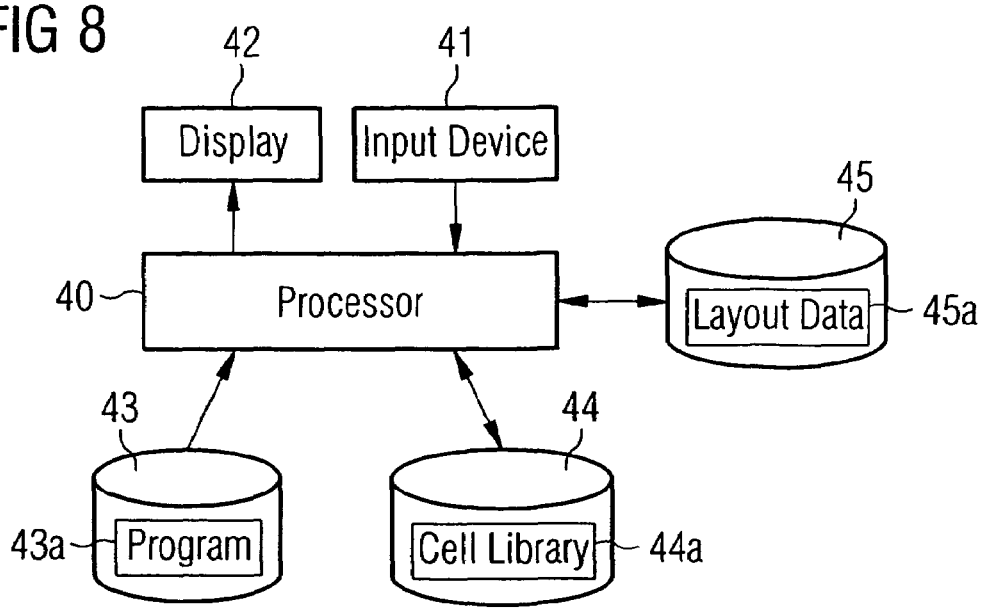
FIG. 8 is a schematic block diagram of a computer system adapted for design flow calculation.

Computational design flow tools are widely used for designing the layout of semiconductor devices. FIG. 8 is a schematic block diagram of a computer system adapted for design flow calculations. Briefly, the computer system comprises a processor 40, an input device 41, a display 42, a first memory 43, a second memory 44 and a third memory 45. The input device 41, the display 42 and the memories 43 to 45 are connected to the processor 40. Program data 43a of the computer program for design flow development of integrated circuits is stored in memory 43. A cell library 44a containing technology data of the cells to be used in the design flow development process are stored in memory 44. Layout data (i.e. processed data) 45a calculated by the processor 40 is stored in memory 45.

The cell library 44a may be a conventional state-of-the-art cell library, except that two additional cells are contained: the first additional cell is data defining the switch control sub-block 20 as depicted in FIG. 4. The second additional cell is data defining the switch power sub-block 30 also depicted in FIG. 4.

Figure 9:
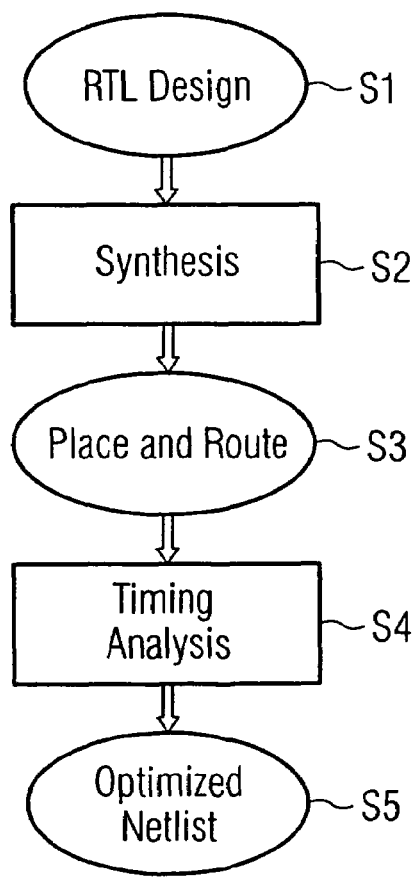
FIG. 9 is a flowchart executed by the computer system of FIG. 8.

The computer system of FIG. 8 executes the (simplified) flowchart of FIG. 9.

In a first design step S1, the desired functionality of the integrated circuit 2' or SoC is described using a hardware description language, in most cases VHDL. This design level is called RTL (register transfer level). In complex SoC systems, step S1 comprises the generation of all modules (memories, processor cores, bus and peripheral components, etc.) of the integrated circuit or SoC.

In step S2, system integration and synthesis is done. The cell coordinates and connectivity netlists for top-level integration are extracted and the netlist is synthesized. The netlist describes the logical cells contained in the integrated circuit to be designed and the cell connections.

Steps S1 and S2 are well-known in the state-of-the-art.

In step S3, arranging and wiring (so-called "place and route") of the cells is done. The pad ring 5 is created and the power nets of the integrated circuit are routed. In this step, the cells switch control 20 and switch power 30 are arranged to establish one or more embedded switchable power rings 13 as illustrated in FIGS. 5 to 7. Thus, it is not necessary to place spacer cells between switch control cells 20 and switch power cells 30 and/or switch power cells 30 and adjacent switch power cells 30. The embedded switchable power ring 13 may be placed and routed by using algorithms which already exist to place pad rings in the design. Then, level shifters and isolation clamp cells at domain boundaries as well as the remaining standard cells are placed and routed.

After completing global routing in step S3, timing analysis (step S4) is performed in order to calculate the optimised netlist S5. Steps S4 and S5 may be performed by any appropriate timing analysis tool known in the state-of-the-art.

What is claimed is:

1. An integrated circuit comprising:
an embedded switchable power ring for supplying power to circuit modules arranged within the switchable power ring, said switchable power ring comprising:
a switch control unit configured to generate an on/off control signal; and
multiple switch power units coupled to the switch control unit, and configured to provide a switched current to the circuit modules in response to the on/off control signal, which is routed from one switch power unit to another switch power unit;
wherein the embedded switchable power ring is arranged in a ring shape on the integrated circuit.

2. The integrated circuit according to claim 1, wherein the switch control unit of the switchable power ring is an integral part of the ring shape.

3. The integrated circuit according to claim 1, wherein the switch control unit and the switch power units are designed so as to directly abut to one another.

4. The integrated circuit according to claim 1, wherein a plurality of embedded switchable power rings are established on the integrated circuit.

5. The integrated circuit according to claim 1, wherein each switch power unit comprises a transistor controlled by the on/off control signal.

6. A method for supplying power, comprising:
generating an on/off control signal by a switch control unit, wherein said switch control unit is part of a switchable power ring of an integrated circuit;
applying the on/off control signal to a plurality of switch power units arranged in a ring shape as part of the switchable power ring;
routing the on/off control signal from one switch power unit to another switch power unit; and
providing a switched current by the switch power units, wherein the switched current provides a power supply for circuit modules arranged within the switchable power ring.

7. The method according to claim 6, wherein the switch control unit of the switchable power ring is an integral part of the ring shape.

8. The method according to claim 6, wherein the embedded switchable power ring comprises two global power wires and one switched power wire, wherein one of the global power wires and the switched power wire are connected to the circuit modules arranged within the switchable power ring.

9. The method according to claim 6, wherein the switch control unit and the switch power units are designed so as to directly abut to one another.

10. The method according to claim 6, wherein a plurality of embedded switchable power rings are established on the integrated circuit.

11. A method for supplying power to circuit modules, comprising:
generating an on/off control signal by a switch control unit;
applying the on/off control signal to a plurality of switch power units arranged in a ring shape on an integrated circuit, wherein said integrated circuit comprises a switchable power ring;
providing a switched current by the switch power units to provide a power supply to the circuit modules arranged within the switchable power ring, wherein said switchable power ring comprises two global power wires and one switched power wire, which are established in two metal layers of the integrated circuit; and
connecting one of the global power wires and the switched power wire to the circuit modules arranged within the switchable power ring.

12. The method according to claim 11, wherein the two metal layers are metal2 and metal3.

13. An integrated circuit comprising:
an embedded switchable power ring for supplying power to circuit modules arranged within the switchable power ring, said switchable power ring comprising:
a switch control unit configured to generate an on/off control signal;
multiple switch power units coupled to the switch control unit, and configured to provide a switched current to the circuit modules in response to the on/off control signal; and
two global power wires and one switched power wire, wherein one of the global power wires and the switched power wire are connected to and completely surround the circuit modules arranged within the switchable power ring,
wherein the embedded switchable power ring is arranged in a ring shape on the integrated circuit.

14. The integrated circuit according to claim 13, wherein the two global power wires and the one switched power wire are established in two metal layers of the integrated circuit.

15. The integrated circuit according to claim 14, wherein the two metal layers are metal2 and metal3.

16. A method for supplying power, comprising:
generating an on/off control signal by a switch control unit, wherein said switch control unit is part of a switchable power ring of an integrated circuit;
applying the on/off control signal to a plurality of switch power units arranged in a ring shape as part of the switchable power ring; and providing a switched current by the switch power units, wherein the switched current provides a power supply for circuit modules arranged within the switchable power ring, wherein the switchable power ring comprises two global power wires and one switched power wire, wherein one of the global power wires and the switched power wire are connected to and completely surround the circuit modules arranged within the switchable power ring.

17. The method according to claim 16, wherein each switch power unit comprises a transistor controlled by the on/off control signal.

* * * * *